United States Patent
Parra et al.

(10) Patent No.: US 7,603,401 B2
(45) Date of Patent: *Oct. 13, 2009

(54) METHOD AND SYSTEM FOR ON-LINE BLIND SOURCE SEPARATION

(75) Inventors: Lucas Cristobal Parra, Lawrenceville, NJ (US); Clay Douglas Spence, Princeton Junction, NJ (US)

(73) Assignee: Sarnoff Corporation, Princeton, NJ (US)

( * ) Notice: Subject to any disclaimer, the term of this patent is extended or adjusted under 35 U.S.C. 154(b) by 981 days.

This patent is subject to a terminal disclaimer.

(21) Appl. No.: 11/095,346

(22) Filed: Mar. 31, 2005

(65) Prior Publication Data

US 2005/0240642 A1    Oct. 27, 2005

Related U.S. Application Data

(60) Division of application No. 09/597,105, filed on Jun. 20, 2000, now Pat. No. 6,898,612, which is a continuation-in-part of application No. 09/191,217, filed on Nov. 12, 1998, now Pat. No. 6,167,417.

(60) Provisional application No. 60/151,838, filed on Sep. 1, 1999.

(51) Int. Cl.
*G06F 15/10* (2006.01)
*G06F 17/10* (2006.01)
(52) U.S. Cl. .................................. 708/405; 708/319
(58) Field of Classification Search ................ 708/405, 708/319
See application file for complete search history.

(56) References Cited

U.S. PATENT DOCUMENTS 5,999,561 A    12/1999    Naden et al.

(Continued)

FOREIGN PATENT DOCUMENTS

FR    2679083    1/1993

(Continued)

OTHER PUBLICATIONS

1. Parra, et al., "Convolutive Blind Separation of Non-Stationary Sources," IEEE Transactions on Speech and Audio Processing, vol. 8, No. 3, May 2000, 320-327.

(Continued)

*Primary Examiner*—Tan V Mai
(74) *Attorney, Agent, or Firm*—Lowenstein Sandler PC

(57) ABSTRACT

A method and apparatus is disclosed for performing blind source separation using convolutive signal decorrelation. For a first embodiment, the method accumulates a length of input signal (mixed signal) that comprises a plurality of independent signals from independent signal sources. The invention then divides the length of input signal into a plurality of T-length periods (windows) and performs a discrete Fourier transform (DFT) on the signal within each T-length period. Thereafter, estimated cross-correlation values are computed using a plurality of the averaged DFT values. A total number of K cross-correlation values are computed, where each of the K values is averaged over N of the T-length periods. Using the cross-correlation values, a gradient descent process computes the coefficients of a FIR filter that will effectively separate the source signals within the input signal. A second embodiment of the invention is directed to on-line processing of the input signal—i.e., processing the signal as soon as it arrives with no storage of the signal data. In particular, an on-line gradient algorithm is provided for application to non-stationary signals and having an adaptive step size in the frequency domain based on second derivatives of the cost function. The on-line separation methodology of this embodiment is characterized as multiple adaptive decorrelation.

19 Claims, 3 Drawing Sheets

U.S. PATENT DOCUMENTS 5,999,651 A 12/1999 Chang et al.
6,005,900 A 12/1999 Zangi
6,011,813 A 1/2000 Ghosh

FOREIGN PATENT DOCUMENTS

WO  WO 99/52211  10/1999

OTHER PUBLICATIONS

2. Parra, et al, "Convolutive Blind Source Separation based on Multiple Decorrelation," Proc. 1998 IEEE Signal Proc. Soc. Workshop, New York, 1998, 23-32.
3. Pun et al., "A Simple Variable Step Algorithm for Blind Course Separation (BSS)," Neutral Networks for Signal Processing VIII, Proc. 1998 IEEE Signal Proc. Soc. Workshop, Cambridge UK, 73-82.
4. Jones, D, "A New Method for Blind Source Separation of Nonstationary Signals," 1999 IEEE International Conf. on Acoustics, Speech and Signal Proc., Phoenix, AZ 15-19, 1999.

METHOD AND SYSTEM FOR ON-LINE BLIND SOURCE SEPARATION

CROSS-REFERENCE TO RELATED APPLICATIONS

This application is a Divisional of application Ser. No. 09/597,105, filed Jun. 20, 2000 now U.S. Pat. No. 6,898,612, which is a Continuation-In-Part of application Ser. No. 09/191,217, entitled "Convolutive Blind Source Separation Using A Multiple Decorrelation Method" filed Nov. 12, 1998 now U.S. Pat. No. 6,167,417.

This application claims the benefit of U.S. Provisional Application No. 60/151,838 filed Sep. 1, 1999, which is herein incorporated by reference.

FIELD OF THE INVENTION

The invention relates to signal processing and, more particularly to a method and apparatus for performing on-line blind source signal separation.

BACKGROUND OF THE INVENTION

In the art of speech processing, it is necessary in some circumstances to separate a mixture of differently convolved and mixed signals—where those signals typically emanate from multiple sources—without a priori knowledge of those signals. Such a separation of a composite signal into its constituent component signals is known as blind source separation (BSS), and various BSS techniques are known in the art. These techniques are useful for separating source signals that are simultaneously produced by independent sources—e.g., multiple speakers, sonar arrays, and the like, and which signals are combined in a convolutive medium. BSS techniques may be applied in such applications as speech detection using multiple microphones, crosstalk removal in multichannel communications, multipath channel identification and equalization, direction of arrival (DOA) estimation in sensor arrays, improvement of beam forming microphones for audio and passive sonar, and discovery of independent source signals in various biological signals, such as EEG, MEG and the like.

Most of the known BSS algorithms try to invert a multipath acoustic environment by finding a multi-path finite impulse response (FIR) filter that approximately inverts the forward channel. However, a perfect inversion may require fairly long FIR filters—such situations particularly occurring in strongly echoic and reverberant rooms where most, if not all, current algorithms fail. Additionally, changing forward channels due to moving sources, moving sensors, or changing environments require an algorithm that converges sufficiently quickly to maintain an accurate current inverse of the channel.

Two general types of BSS algorithms are known in the art for blind source separation of a convolutive mixture of broadband signals: (1) algorithms that diagonalize a single estimate of the second order statistics, and (2) algorithms that identify statistically independent signals by considering higher order statistics. Algorithms of the first type generate decorrelated signals by diagonalizing second order statistics and have a simple structure that can be implemented efficiently. [See, e.g., E. Weinstein, M. Feder, and A. V. Oppenheim, "Multi-Channel Signal Separation by Decorrelation", *IEEE Trans. Speech Audio Processing*, vol. 1, no. 4, pp. 405-413, April 1993; S. Van Gerven and D. Van Compernolle, "Signal Separation by Symmetric Adaptive Decorrelation: Stability, Convergence, and Uniqueness", *IEEE Trans. Signal Processing*, vol. 43, no. 7, pp. 1602-1612, July 1995; K.-C. Yen and Y. Zhao, "Improvements on co-channel separation using ADF: Low complexity, fast convergence, and generalization", in *Proc. ICASSP* 98, Seattle, Wash., 1998, pp. 1025-1028; M. Kawamoto, "A method of blind separation for convolved non-stationary signals", *Neurocomputing*, vol. 22, no. 1-3, pp. 157-171, 1998; S. Van Gerven and D. Van Compernolle, "Signal separation in a symmetric adaptive noise canceler by output decorrelation", in *Proc. ICASSP* 92, 1992, vol. IV, pp. 221-224.] However, they are not guaranteed to converge to the right solution, as single decorrelation is not a sufficient condition to obtain independent model sources. Instead, for stationary signals higher order statistics have to be considered, either by direct measurement and optimization of higher order statistics [See, e.g., D. Yellin and E. Weinstein, "Multichannel Signal Separation: Methods and Analysis", *IEEE Trans. Signal Processing*, vol. 44, no. 1, pp. 106-118, 1996; H.-L. N. Thi and C. Jutten, "Blind source separation for convolutive mixtures", *Signal Processing*, vol. 45, no. 2, pp. 209-229, 1995; S. Sharnsunder and G. Giannakis, "Multichannel Blind Signal Separation and Reconstruction", *IEEE Trans. Speech Audio Processing*, vol. 5, no. 6, pp. 515-528, Nov. 997], or indirectly by making assumptions on the shape of the cumulative density function (cdf) of the signals [See, e.g., R. Lambert and A. Bell, "Blind Separation of Multiple Speakers in a Multipath Environment", in *Proc. ICASSP* 97, 1997, pp. 423-426; S. Amari, S. C. Douglas, A. Cichocki, and A. A. Yang, "Multichannel blind deconvolution using the natural gradient", in *Proc. 1st IEEE Workshop on Signal Processing App. Wireless Comm.*, 1997, pp. 101-104; T. Lee, A. Bell, and R. Lambert, "Blind separation of delayed and convolved sources", in *Proc. Neural Information Processing Systems* 96, 1997]. The former methods are fairly complex and difficult to implement. The latter methods fail in cases where the assumptions on the cdf are not accurate.

A limited body of on-line BSS algorithms is also known, generally for the case of single decorrelation and for indirect higher order methods, and having the same limitations as their off-line counterparts. [See, e.g., E. Weinstein, M. Feder, and A. V. Oppenheim, "Multi-Channel Signal Separation by Decorrelation", *IEEE Trans. Speech Audio Processing*, vol. 1, no. 4, pp. 405-413, April 1993; S. Van Gerven and D. Van Compernolle, "Signal Separation by Symmetric Adaptive Decorrelation: Stability, Convergence, and Uniqueness", *IEEE Trans. Signal Processing*, vol. 43, no. 7, pp. 1602-1612, July 1995; K.-C. Yen and Y. Zhao, "Improvements on co-channel separation using ADF: Low complexity, fast convergence, and generalization", in *Proc. ICASSP* 98, Seattle, Wash., 1998, pp. 1025-1028; K-C Yen and Y. Zhao, "Adaptive Co-Channel Speech Separation and Recognition", *IEEE Trans. Signal Processing*, vol. 7, no. 2, March 1999; S. Amari, C. S. Douglas, A. Cichocki, and H. H. Yang, "Novel On-Line Adaptive Learning Algorithms for Blind Deconvolution Using the Natural Gradient Approach", in *Proc. 11th IFAC Symposium on System Identification*, Kitakyushu City, Japan, July 1997, vol. 3, pp. 1057-1062; P. Smaragdis, "Blind separation of convolved mixtures in the frequency domain", *Neurocomputing*, vol. 22, pp. 21-34, 1998.] Single decorrelation algorithms have also been described that purport to operate on non-stationary signals [See, e.g., M. Kawamoto, "A method of blind separation for convolved non-stationary signals", *Neurocomputing*, vol. 22, no. 1-3, pp. 157-171, 1998; T. Ngo and N. Bhadkamkar, "Adaptive blind separation of audio sources by a physically compact device using second-order statistics", in *ICA'99*, Loubaton Cardoso, Jutten, Ed., 1999, pp. 257-260; H. Sahlin and H. Broman, "Separation of real-world signals", *Signal Processing*, vol. 64, pp. 103-104, 1998]. However, the art is not believed to provide an on-line BSS method which yields fast convergence for non-static filters—an essential criteria, since the data may be visited only once.

Therefore, there is a need for a blind source separation technique that accurately and quickly performs convolutive signal decorrelation.

SUMMARY OF THE INVENTION

The disadvantages of the prior art are overcome by a method and apparatus that performs blind source separation using convolutive signal decorrelation by simultaneously diagonalizing second order statistics at multiple time periods in the frequency domain. More specifically, in a first embodiment, the invention accumulates a length (segment) of input signal that comprises a mixture of independent signal sources. The invention then divides the length of input signal into a plurality of T-length periods (windows) and performs a discrete Fourier transform (DFT) on the mixed signal over each T-length period. Thereafter, the invention computes K cross-correlation power spectra that are each averaged over N of the T-length periods. Using the cross-correlation power values, a gradient descent process computes the coefficients of an FIR filter that will effectively separate the source signals within the input signal by simultaneously decorrelating the K cross-correlation power spectra.

To achieve an accurate solution, the gradient descent process is constrained in that the time-domain values of the filter coefficients can attain only certain values—i.e., the time-domain filter coefficient values $W(\tau)$ are constrained within the T-length period to be zero for any time $\tau > Q \ll T$. In this manner, the so-called "permutation problem" is solved and a unique solution for the FIR filter coefficients is computed such that a filter produced using these coefficients will effectively separate the source signals.

For circumstances where it is not practical to accumulate a length of input signal for processing according to the method of the first embodiment, a second embodiment of the invention is directed to on-line processing of the input signal—i.e., processing the signal as soon as it arrives with no storage of the signal data. In particular, an on-line gradient algorithm is provided for application to non-stationary signals and having an adaptive step size in the frequency domain based on second derivatives of the cost function. The on-line separation methodology of this embodiment is characterized as multiple adaptive decorrelation (MAD).

Generally, either embodiment of the invention may be implemented as a software routine that is stored in a storage medium and executed on a general purpose computer system. However, a hardware implementation is readily apparent from the following detailed description.

The present invention finds application in a voice recognition system as a signal preprocessor system for decorrelating signals from different sources such that a voice recognition processor can utilize the various voice signals without other interfering noise sources. In response to the voice signal, the voice recognition processor can then produce computer commands or computer text.

BRIEF DESCRIPTION OF THE DRAWINGS

The teachings of the present invention can be readily understood by considering the following detailed description in conjunction with the accompanying drawings, in which.

DETAILED DESCRIPTION OF INVENTION

An important aspect of the methodology of the invention is the recognition that, with non-stationary signals, the non-stationarity can be exploited to decorrelate the estimated sources in a BSS environment at multiple times—i.e. at such multiple times, one will have different correlations. With the computation of the cross correlations among the multiple non-stationary signals, a different cross correlation measure will be determined at a first time than at a second, later time. In this non-stationary, multiple source environment, a separation algorithm according to the method of the invention, operates on the temporally-separated multiple cross correlations to simultaneously diagonalize them. Two embodiments of the method of the invention are described below. In a first embodiment, all cross correlations are first computed from the entire signal. A gradient descent algorithm then computes the best diagonalizing filters, with which the signals are subsequently filtered. In the second embodiment, a single running estimate of the changing cross correlation is maintained. An on-line gradient descent algorithm updates filters to diagonalize the current cross correlation. The updated filters are immediately applied to the incoming signal.

The basic source separation problem is simply described by assuming $d_s$ non-stationary decorrelated source signals $s(t)=[s_1(t), \ldots, s_{d_s}(t)]^T$ that have been convolved and mixed in a linear medium. These signals are observed in a multi-path environment $A(\tau)$ of order P as $x(t)=[x_1(t), \ldots, x_{d_x}(t)]^T$ ($d_x$ representing the number of sensor signals). It is further assumed that $d_s \leq d_x$—i.e., at least as many sensors as sources. The convolved, noisy signal is represented in the time domain by the following equation (known as a forward model):

$$x(t) = \sum_{\tau=0}^{P} A(\tau)s(t-\tau) + n(t) \quad (1)$$

where n(t) represents additional sensor noise.

Source separation techniques are used to identify the $d_x d_s P$ coefficients of the channels A and to ultimately determine an estimate $\hat{s}(t)$ for the unknown source signals.

Alternatively, under certain conditions on the coefficients of $A(\tau)$, the multi-path channel is invertible with a finite impulse response (FIR) multi-path filter $W(\tau)$ of suitably chosen length Q. That inverse model (known as the backward model) is represented by the following equation:

$$\hat{s} = u(t) = \sum_{\tau=0}^{Q} W(\tau)x(t-\tau) \quad (2)$$

The method of the invention estimates values of parameters W for the backward model of equation 2 by assuming nonstationary source signals and using a least squares (LS) optimization to estimate W, as well as signal and noise powers.

I. Description of an Off-Line Multiple Decorrelation Embodiment

Figure 1:
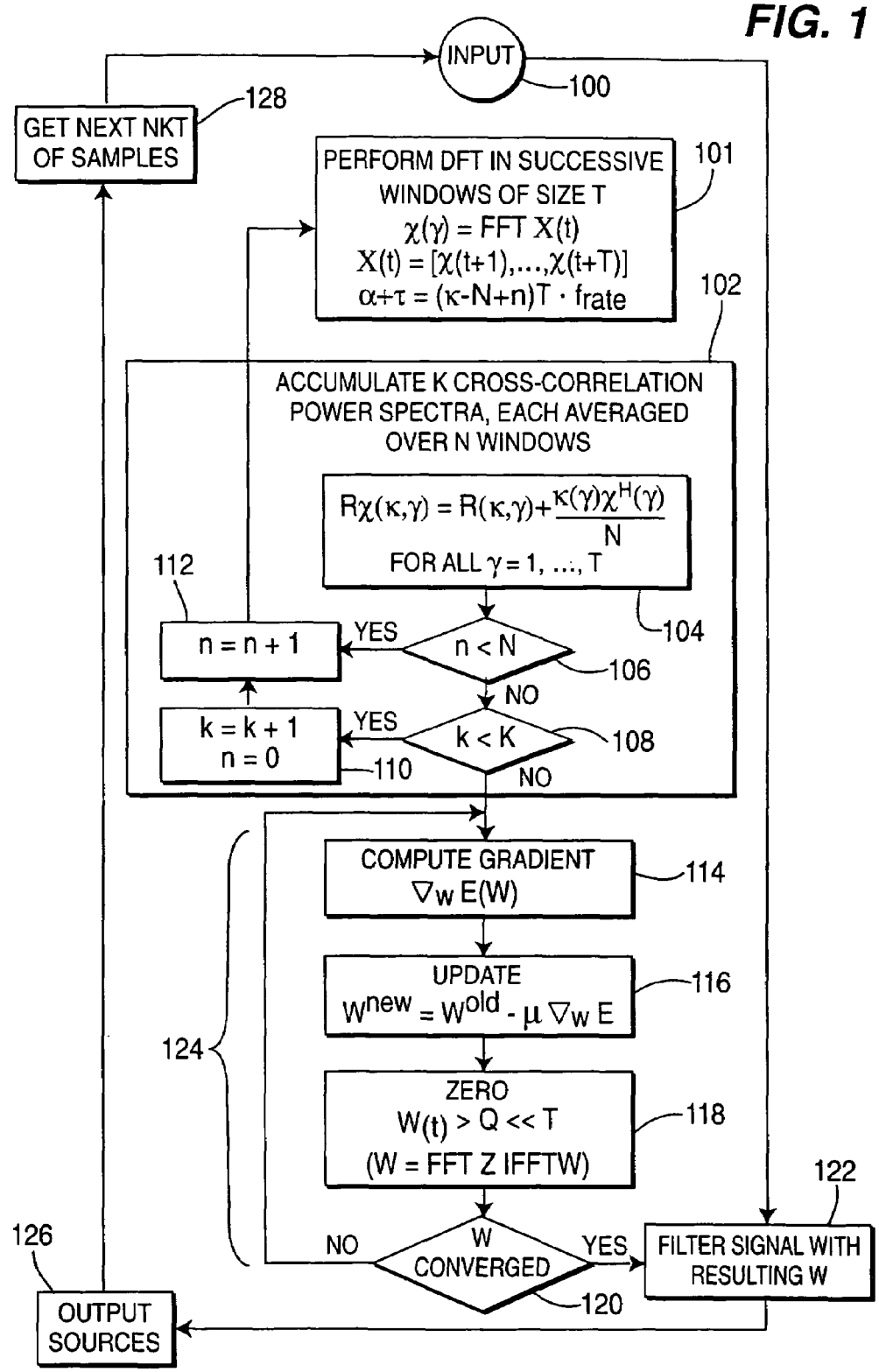
FIG. 1 depicts a flow diagram of an embodiment of the present invention.

An embodiment of the invention directed to off-line source separation using multiple decorrelation is described hereafter in conjunction with a flow chart for that embodiment depicted in FIG. 1. With reference to the flow chart, the convolutive (mixed) signal is input at step 100, and, at step 101, the signal is parsed into a plurality of windows containing T-samples of the input signal X(t). The routine produces a discrete Fourier transform (DFT) value for each window $\chi(t)$—i.e., one DFT value for each window of length T samples.

At step 102, the method of the invention uses the DFT values to accumulate K cross-correlation power spectra, where each of the K spectra are averaged over N windows of length T samples.

For non-stationary signals, the cross correlation estimates will be dependent on the absolute time and will indeed vary from one estimation segment (an NT period) to the next. The cross correlation estimates computed in step 104 are represented as:

$$\hat{R}_x(t, v) = \frac{1}{N} \sum_{n=0}^{N-1} \chi(t+nT, v) \chi^T(t+nT, v) \quad (3)$$

where:

$$\chi(t+nT, v) = FFT\ X(t+nT)$$

$$X(t) = [x(t) - x(t+T-1)]$$

and $\chi(v)$ is the FFT of the input signal within a window containing T samples. As such, the routine, at step 104, computes a matrix for each time t and for each frequency $\upsilon$ and then sums all the matrix components with each other matrix component. Steps 106, 108, 110 and 112 iterate the correlation estimation of step 104 over n=0 to N and k=0 to K to produce the K spectra.

Equation 3 can then be simplified to a matrix representation:

$$\hat{R}_x(t,v) = A(v) \Lambda_s(t,v) A^H(v) + \Lambda_n(t,v) \quad (4)$$

If N is sufficiently large, $\Lambda_s(t,\upsilon)$ and $\Lambda_n(t,\upsilon)$ can be modeled as diagonal matrices due to the signal independence assumption. For Equation 4 to be linearly independent for different times, it will be necessary that $\Lambda_s(t,\upsilon)$ changes over time—i.e., the signals are non-stationary.

Using the cross correlation estimates of equation 4, the invention computes the source signals using cross-power-spectra satisfying the following equation:

$$\Lambda_s(t,v) = W(v)(\hat{R}_x(t,v) - \Lambda_n(t,v)) W^H(v) \quad (5)$$

In order to obtain independent conditions for every time period, the time periods are generally chosen to have non-overlapping estimation times for $\hat{R}_x(t_k,\upsilon)$—i.e., $t_k$=kTN. But if the signals vary sufficiently fast, overlapping estimation times may be utilized. Furthermore, although the windows T are generally sequential, the windows may overlap one another such that each DFT value is derived from signal information that is also contained in the previous window. In an audio signal processing system, the specific value of T is selected based upon room acoustics of the room in which the signals are recorded. For example, a large room with many reverberation paths requires a long window T such that the invention can process a substantial amount of signal information to achieve source signal separation. The value of N is generally determined by the amount of available data for processing. Typical values are N=20, T=1024 samples and K=5.

The inventive method computes a multipath channel W (i.e., the tap values of a multidimensional FIR filter) that simultaneously satisfies equation 5 for K estimation periods, e.g., 2 to 5 estimation periods for processing audio signals. Such a process is performed at steps 114, 116, 118 (collectively a filter parameter estimation process 124) and is represented using a least squares estimation procedure as follows:

$$\hat{W}, \hat{\Lambda}_s, \hat{\Lambda}_n = \operatorname*{argmin}_{\substack{W, \Lambda_s, \Lambda_n \\ W(\tau)=0, \tau > Q \\ W_{ii}(v)=1}} \sum_{v=1}^{T} \sum_{k=1}^{K} \|E(k, v)\|^2 \quad (6)$$

where $$E(k, v) = W(v)(\hat{R}_x(k, v) - \Lambda_n(k, v)) W^H(v) - \Lambda_s(k, v)$$

For simplicity, a short form nomenclature has been used in equation 6, where $\Lambda_s(k,v) = \Lambda_s(t_k,v)$ and $\Lambda_s = \Lambda_s(t_l, v), \ldots, \Lambda_s(t_k,v)$ and the same simplified notation also applies to $\Lambda_n(t, \upsilon)$ and $R_x(t,\upsilon)$.

To produce the parameters W, a gradient descent process 124 (containing steps 114, 116, 118, and 120) is used that iterates the values of W as cost function (6) is minimized. In step 116, the W values are updated as $W^{new} = W^{old} - \mu \nabla_W E$, where $\nabla_W E$ is the gradient step value and $\mu$ is a weighting constant that controls the size of the update. More specifically, the gradient descent process determines the gradient values as follows.

$$\frac{\partial E}{\partial W^*(v)} = \sum_{k=1}^{K} E(k, v) W(v) B^H(k, v) \quad (7)$$

$$\frac{\partial E}{\partial \hat{\Lambda}_s^*(k)} = -diag(E(k, v)) \quad (8)$$

$$\frac{\partial E}{\partial \hat{\Lambda}_n^*(k)} = -diag(W^H(v) E(k, v) W(v)) \quad (9)$$

$$B(k, v) \equiv \hat{R}_x(k, v) - \Lambda_n(k, v) \quad (10)$$

With equation 8 equal to zero, the routine can solve explicitly for parameters $\Lambda_s(k,\upsilon)$, while parameters $\Lambda_n(k,\upsilon)$ and $W(\upsilon)$ are computed with a gradient descent rule, e.g., new values of $\Lambda_s(k,\upsilon)$ and $W(\upsilon)$ are computed with each pass through the routine until the new values of $W(\upsilon)$ are not very different from the old values of $W(\upsilon)$—i.e., W is converged.

Note that equation 6 contains an additional constraint on the filter size in the time domain. Up to that constraint it would seem the various frequencies $\upsilon=1, \ldots, T$ represent independent problems. The solutions $W(\upsilon)$ however are restricted to those filters that have no time response beyond $\tau > Q << T$. Effectively, the routine parameterizes $Td_s d_x$ filter coefficients in $W(\upsilon)$ with $Qd_s d_x$ parameters $W(\tau)$. In practice, the values of W are produced in the frequency domain, at step 114, e.g., $W(\upsilon)$, then, at step 118, an FFT is performed on these frequency domain values to convert the values of $W(\upsilon)$ to the time domain, e.g., $W(\tau)$. In the time domain, any W value that appears at a time greater than a time Q is set to zero and all values in the range below Q are not adjusted. The adjusted time domain values of are then converted using an inverse FFT back to the frequency domain. By zeroing the filter response in the time domain for all time greater than Q, the frequency response of the filter is smoothed such that a unique solution at each frequency is readily determined.

Figure 3:
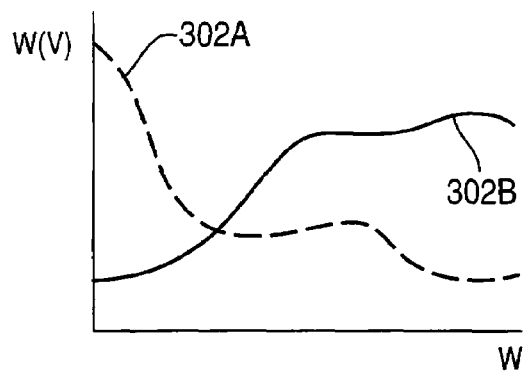
FIG. 3 depicts a schematic frequency domain graph of filter coefficients generated by an embodiment of the present invention.
Figure 4:
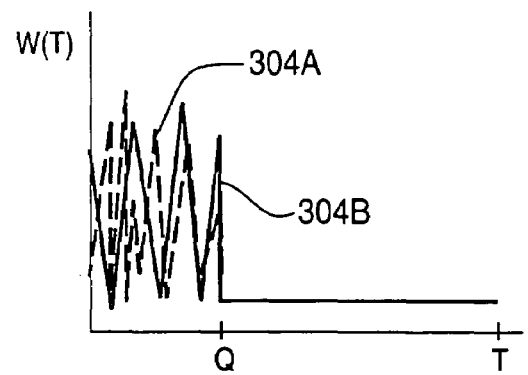
FIG. 4 depicts a schematic time domain graph of the filter coefficients generated by an embodiment of the present invention.

FIG. 3 depicts an illustration of two frequency responses 302A and 302B and FIG. 4 depicts an illustration of their corresponding time-domain responses 304A and 304B. The least squares solutions for the coefficients are found using a gradient descent process performed at step 124 such that an iterative approach is used to determine the correct values of W. Once the gradient in equation 7 becomes "flat" as identified in step 120, the routine, at step 122, applies the computed filter coefficients to an FIR filter. The FIR filter is used to filter the samples of the input (mixed) signal x(t) in the time period KNT in length. The FIR filter generates, at step 126, the decorrelated component signals of the mixed signal. Then, the routine at step 128 gets the next KNT number of samples for processing and proceeds to step 100 to filter the next KNT samples. The previous KNT samples are removed from memory.

II. Description of an On-Line Multiple Decorrelation Embodiment

With the off-line multiple decorrelation method of the prior embodiment, an entire signal segment (of at least several seconds) is divided into different portions—K estimation periods—with the cross correlations for portions being computed. Then the separation algorithm of that embodiment operates to simultaneously make all decorrelations diagonal. The essential point, here, is that, with that embodiment, it is necessary to have the entire signal segment available to the algorithm—otherwise the measurement of the cross correlations at different times would not be possible.

It should readily be understood that this can be a significant limitation in some applications. For many BSS applications involving speech signals, a file representing even several seconds of multiple channels of speech data would be quite large—on the order of megabytes. Storage of data files of this size, particularly in high-speed memory, will often be impractical. Accordingly, a method is provided herein for on-line processing of convolved signal data from multiple sources—i.e., processing such data as soon as it arrives, with no storage of the data. The on-line multiple decorrelation methodology described hereafter embodies the advantages of using temporally-separated multiple decorrelations, while avoiding the necessity for storage of the input data.

A. On-Line Multiple Decorrelation Methodology

Like the decorrelation algorithm of the prior embodiment, the algorithm of this embodiment is a gradient descent algorithm that operates to optimize a particular criteria—that criteria being the decorrelation of the cross correlations across time. [It should be understood, however, that the gradient descent methodology for minimizing a cost function is simply a preferred embodiment of the invention. Other known cost-function optimization methods are equally contemplated within the scope of the invention.] In the operation of the methodology of the invention, the gradient descent algorithm operates to minimize a cost function defined in terms of the separation filters, and to thereby establish the parameters for the filters.

The decorrelation algorithm of the invention operates to provide a running estimate of the cross-correlation matrix—i.e., upon the arrival of a new set of data, the cross-correlation estimates for the prior data set is updated to become the current cross-correlation estimate for the signal data. That running estimate can be used to compute a stochastic gradient of the filter parameter optimization criteria—stochastic gradient being intended to connote a gradient descent algorithm which takes a gradient step for every t instead of summing the total gradient before updating.

Figure 2:
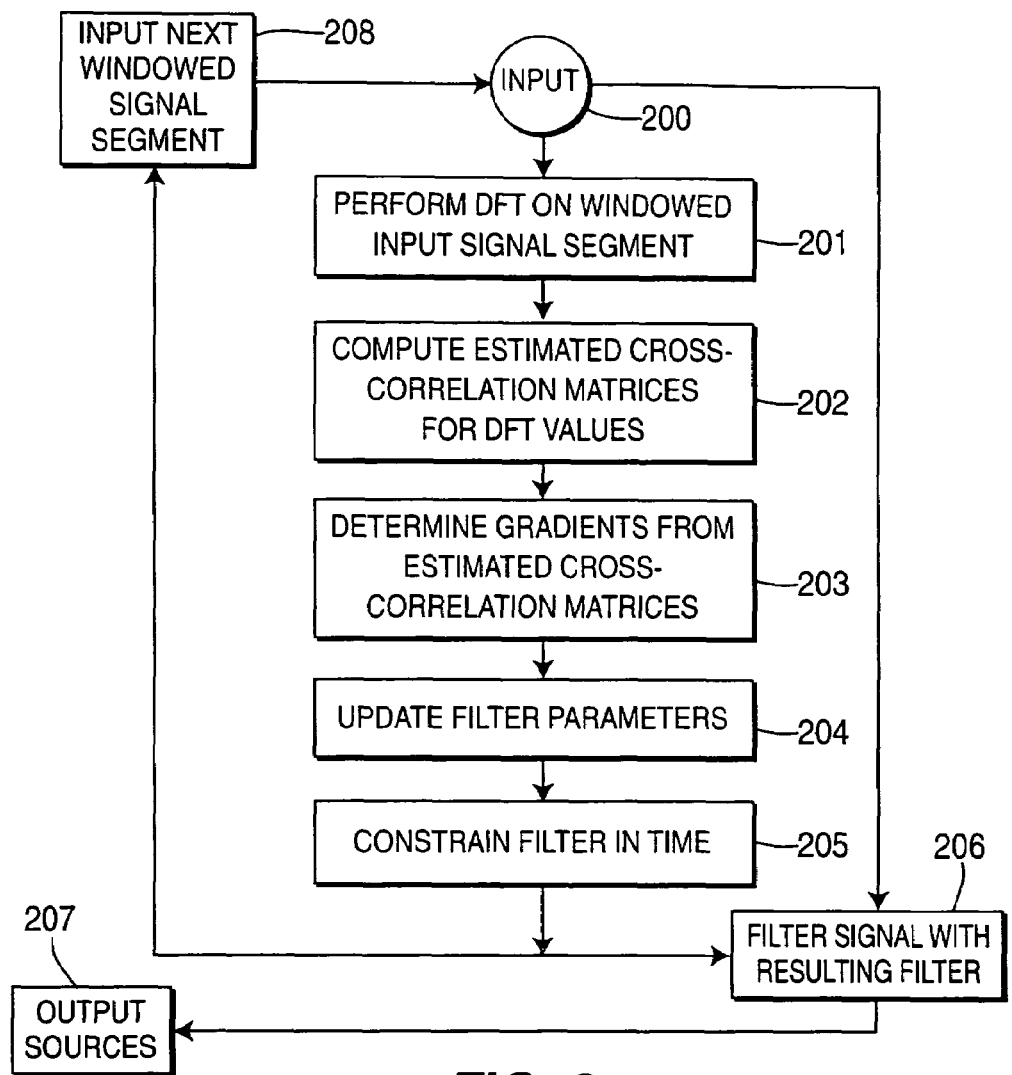
FIG. 2 depicts a flow diagram of another embodiment of the present invention.

Development of the decorrelation algorithm of the invention is shown in the next section. Prior to that discussion, however, the application of that algorithm according to the method of the invention will be functionally described in conjunction with a flow chart for this embodiment of the invention, as shown in FIG. 2.

In the operation of the methodology of the invention, a plurality of input signals are divided into sequences of windowed segments. The windowed segments are input to the invention at step 200 of the flow chart. As each set of windowed segments is input, the signal segments in that window are transformed to the frequency domain using a Discrete Fourier Transform (DFT) at step 201. The DFT transforms of the windowed signal components are then used, at step 202, to compute the estimated cross-correlation matrices—i.e., for every frequency component in the signal segment, a cross-correlation matrix is computed. Using a gradient descent process, gradients corresponding to each of the cross correlation matrices are then determined at step 203. These gradients are then used to compute filter parameter updates, at step 204, according to the decorrelation algorithm of the invention. Note that the BSS environment will include multiple signal inputs and multiple signal outputs, and the decorrelation algorithm of the invention provides a distinct filter between every input and every output. Accordingly, sets of W filter coefficients are developed for a matrix of filters by the decorrelation algorithm.

In practice, the filter parameter values, W, may include unwanted coefficients that actually reduce the efficacy of the filter in separating out the desired signal. Thus, in a preferred embodiment, those unwanted coefficients are eliminated, at step 205, by a temporary conversion of the frequency domain W values (using inverse DFT) back to the time domain. There, any W value that appears at a time greater than a time Q (equal to the filter length) is set to zero and all values in the range below Q are left unchanged. The constrained time domain values of are then converted back to the frequency domain, using DFT. By zeroing the filter response in the time domain for all time greater than Q, the frequency response of the filter is smoothed such that a unique solution at each frequency is readily determined.

In forming the running estimate of the filter parameter updates, the cost function is progressively minimized, using the cross-correlation measures for each successive windowed segment input to the cost function, to find the filter coefficients for the current segment. That current filter is applied to the input signal at step 207 to provide a decorrelation of the desired signal. Concurrently, the process of the invention returns, at step 208, to the input step, with the inputting of the next windowed signal segment.

B. Derivation of On-Line Multiple Decorrelation Algorithm (1) Basic Algorithm

As discussed hereinabove, non-stationary source signals can be recovered by optimizing filter coefficients W such that the estimated sources ŝ(t) have diagonal second order statistics at different times, $$\forall t, \tau : E[\hat{s}(t)\hat{s}^H(t-\tau)] = \hat{\Lambda}_s(t,\tau). \tag{13}$$

Here $\hat{\Lambda}_s(t,\tau)=\text{diag}([\hat{\lambda}_1(t,\tau), \ldots, \hat{\lambda}_{d_s}(t,\tau)])$ represent the autocorrelations of the source signals at times t which have to be estimated from the data. This criteria determines the estimate ŝ(t) at best up to a permuted and convolved version of the original sources s(t). In the off-line multiple decorrelation embodiment, heretofore described, second-order statistics at multiple times were estimated and simultaneously diagonalized in the frequency domain.

For the on-line case of the present embodiment, the cost function needed to develop the filter parameters is initially developed in the time domain directly, and the algorithm thereafter transferred into the frequency domain to get a more efficient and faster-converging on-line update rule. The sample average starting at time t is used for the expectation—i.e., $E[f(t)]=\Sigma_{\tau'} f(t+\tau^1)$. A separation criteria can then be defined for simultaneous diagonalization with:

$$J(W) = \sum_t J(t, W) = \sum_t \|J(t, W)\|^2 \quad (14)$$

$$= \sum_{t,\tau} \left\| E[\hat{s}(t)\hat{s}^H(t-\tau)] - \hat{\Lambda}_s(t, \tau) \right\|^2 \quad (15)$$

$$= \sum_{t,\tau} \left\| \sum_{\tau'} \hat{s}(t+\tau')\hat{s}^H(t-\tau+\tau') - \hat{\Lambda}_s(t, \tau) \right\|^2 \quad (16)$$

where the Frobenius norm given by $\|J\|^2=\text{Tr}(JJ^H)$ is used. One may now search for a separation filter by minimizing J (W) with a gradient algorithm. Specifically, a stochastic gradient approach is followed where the minimization function takes a gradient step $$\frac{\partial J(t, W)}{\partial W(l)}$$

for every t (as opposed to summing the total gradient before updating). [Note that the optimal estimates of the autocorrelation $\Lambda_s(t,\tau)$ for a given W are the diagonal elements of $E[\hat{s}(t)\hat{s}^H(t-\tau)]$. Therefore only the gradient with respect to W is needed.] That stochastic gradient approach leads to the following expression, $$\frac{\partial J(t, W)}{\partial W(l)} = \sum_\tau \left( \sum_{\tau'} \hat{s}(t+\tau')\hat{s}^H(t+\tau'-\tau) - \hat{\Lambda}_s(t,\tau) \right) \times$$
$$\sum_{\tau''} \hat{s}(t+\tau''-\tau)\hat{x}^H(t+\tau''-l) +$$
$$\sum_\tau \left( \sum_{\tau'} \hat{s}(t+\tau'-\tau)\hat{s}^H(t+\tau') - \hat{\Lambda}_s(t,\tau) \right) \times$$
$$\sum_{\tau''} \hat{s}(t+\tau'')\hat{x}^H(t+\tau''-\tau-l)$$

To simplify this expression, it can be shown that the first and second sums over τ can be made equal. In the gradient descent procedure one may choose to apply the different gradient terms in these sums at times other than the time t. Following that argument, t can be replaced with t−τ in the second sum, which effectively uses the value of the sum in the gradient update at time t'=t−τ. In addition, with the assumption of symmetry for the τ sums over positive and negative values, the sign of τ can be changed in the second sum. It is also reasonable to suggest that the diagonal matrix $\Lambda_s(t, \tau)$ remains unchanged by these transformations, at least in a quasi-stationary approximation. The resulting filter parameter update at time t for lag l with a step size of µ simplifies to $$\Delta_t W(l) = -2\mu \sum_\tau \left( \sum_{\tau'} \hat{s}(t+\tau')\hat{s}^H(t+\tau'-\tau) - \hat{\Lambda}_s(t-\tau) \right) \times \quad (17)$$
$$\sum_{\tau''} \hat{s}(t+\tau''-\tau)\hat{x}^H(t+\tau''-l)$$

The sums over τ' and τ'' represent the averaging operations while the sum over τ stems from the correlation in Equation 13. The estimated cross-correlation of the sensor signals may be denoted as $$\hat{R}_x(t,\tau)=E[\hat{x}(t)\hat{x}^H(t-\tau)]. \quad (18)$$

By inserting Equation 2 into Equation 17, and using the relationship of Equation 18, an expression is obtained for the filter parameter update at time t, as $$\Delta_t W = -2 \mu J(t)^* W * \hat{R}_x(t) \quad (19)$$

with $J(t)=W*\hat{R}_x(t)*W^H-\hat{\Lambda}_s(t)$

In the short hand notation of this update expression, convolutions are represented by *, and correlations by *, and time lag indices are omitted. In the derivation of this update expression, it is assumed that the estimated cross-correlations don't change much within the time scale corresponding to one filter length, i.e. $\hat{R}_x(t,\tau) \approx R_x(t+l, \tau)$ for $0 < l \leq Q$.

(2) Frequency Domain Conversion

In the signal processing arts, it is known to operate in the frequency domain, rather than the time domain, in order to enhance the efficacy of a computational algorithm. Accordingly, a set of time-domain signal data may be converted to the frequency domain for processing of that data. This motivation is particularly applicable for BSS algorithms because the filters typically used for separation of the signal data are essentially addressed to convolutions and such convolutions are much more effectively handled in the frequency domain than in the time domain.

To that end, an on-line frequency domain implementation of the basic time-domain gradient algorithm is described below. In the development of that frequency domain implementation, an effort is made to reduce the computational cost as well as improve the convergence properties of the gradient updates.

Because the convolutions in Equations 19 are expensive to compute, this gradient expression is transformed into the frequency domain with T frequency bins. If one assumes small filters compared to the number of frequency components, i.e. Q<<T, the convolutions factor approximately. Thus to a good approximation the stochastic gradient update rule of Equation 19 is transformed to the frequency domain as:

$$\Delta_t W(\omega)=2 \mu J(t,\omega)W(\omega)\hat{R}_x(t,\omega) \quad (20)$$

with $J(t,\omega)=W(\omega)\hat{R}_x(t,\omega)W^H(\omega)-\hat{\Lambda}_s(t,\omega)$ Here W(ω), representing the filter parameters for the signal frequency component under consideration, and $\hat{R}_x(t,\omega)$, representing the running estimate of cross correlation, are, respectively, the T-point discrete Fourier transform of $W(\tau)$ and $R_x(t,\tau)$; t represents the time at which a current estimate is made.

It is noted that the same expression can be obtained directly in the frequency domain by using the gradient of $\Sigma_{t,107} J(t,W) = \Sigma_{t,\omega} \|J(t,\omega)\|^2$ with respect to $W^*$. In a gradient rule with complex variables this represents the combination of the partial derivatives with respect to the real and complex parts of W. In this formalism the update rule for a complex parameter $\omega$ with learning rate $\mu$ is $$\Delta \omega = 2\mu \frac{\partial}{\partial \omega^*}.$$

(3) Adaptive Power Normalization

In a further refinement of this embodiment of the invention, it is preferred that some second order gradient expressions be considered, a refinement which is expected to improve the convergence properties of the decorrelation algorithm of the invention. A proper Newton-Raphson update requires the inverse of the Hessian matrix. Computing the exact inverse Hessian seems to be quite difficult in this case. A common approach is to neglect the off-diagonal terms of the Hessian. This should give efficient gradient updates in the case that the coefficients are not strongly coupled. If the constraints on the filter size in the time domain are ignored, the approximate frequency domain gradient updates depend only on $W(\omega)$, as can be seen in Equation 20. The parameters are therefore decoupled for different frequencies. However the several elements of $W(\omega)$ at a single frequency may be strongly dependent, in which case a diagonal approximation of the Hessian would be quite poor. Accordingly, it appears unwise to modify the gradient directions of the matrix elements $W(\omega)$ for a given frequency. Instead, for the preferred embodiment, the original gradient is followed, but the step size should be adapted with a normalization factor $h(t,(\omega)$ for different frequencies. Thus the update expression becomes:

$$\Delta_t W(\omega) = -\mu h^{-1}(t,\omega) \frac{\partial J(t,\omega)}{\partial W^*(\omega)} \quad (21)$$

where $\mu$ is a fixed learning constant, and h is a weighting factor for the step-size adaptation An appropriate step size normalization factor can be determined as follows. For a real valued square cost, $J(z)=azz^*$ in the complex plane, the proper second order gradient step corresponds to $(\partial^2 J(z)/\partial z \partial z^*)^{-1} \partial J(z)/\partial z^* = z$. The corresponding expression in the current cost function can be computed to $$\frac{\partial^2 J}{\partial^2 w_{ij}^* \partial^2 w_{ij}} = 2((WR_x)^H (WR_x))_{jj}.$$

It is real valued and independent of i. It is preferred that the same step size be used for all j, and therefore a sum over j is used. The step size normalization factor becomes:

$$h(t,\omega) = \sum_j \frac{\partial^2 J(t,\omega)}{\partial W_{ij}^*(\omega) \partial W_{ij}(\omega)} = \|W(\omega)\hat{R}_x(t,\omega)\|^2 \quad (22)$$

This is effectively an adaptive power normalization. The inventors have empirically determined that, with the use of such a step-size adaptation for the update algorithm, the resulting updates were stable and lead to faster convergence.

(4) Elimination of Unwanted Filter Coefficients

The filter parameter values, W, may include unwanted coefficients that actually reduce the efficacy of the filter in separating out the desired signal. Thus, in a preferred embodiment, at each update iteration, those unwanted coefficients are eliminated by a temporary conversion of the frequency domain $(W(\omega))$ values (using inverse DFT) back to the time domain. There, the filter solutions are restricted to those filters that have no time response beyond $\tau > Q << T$. Effectively, the routine parameterizes $Td_s d_x$ filter coefficients in $W(\omega)$ with $Qd_s d_x$ parameters $W(\tau)$. In practice, the values of W are produced in the frequency domain and an inverse DFT is performed on these frequency domain values to convert the values to the time domain. In the time domain, any W value that appears at a time greater than a time Q is set to zero and all values in the range below Q are not adjusted. The adjusted time domain values of are then converted using DFT back to the frequency domain. By zeroing the filter response in the time domain for all time greater than Q, the frequency response of the filter is smoothed such that a unique solution at each frequency is readily determined.

(5) Operation of the Decorrelation Algorithm

As already described in connection with the flow chart of FIG. 2, the decorrelation algorithm of the invention is implemented as a block processing procedure. The signals are windowed and transformed into the frequency domain, i.e. the segment $x_i(t), \ldots, x_i(t+T-1)$ gives frequency components $x_i(t,\omega)$ for $\omega=0, \ldots, T-1$. These are used to compute the estimated cross-correlations directly in the frequency domain, i.e. $\hat{R}_x(t,\omega) = E[x(t,\omega)x^H(t,\omega)]$. In an on-line algorithm the expectation operation is typically implemented as an exponentially windowed average of the past. For the cross-correlations of the observations in the frequency domain this reads $$\hat{R}_x(t,\omega) = (1-\gamma)\hat{R}_x(t,\omega) + \gamma x(t,\omega)x^H(t,\omega). \quad (23)$$

where $\gamma$ represents a forgetting factor to be chosen according to the stationarity time of the signal. Also at time t, a gradient step, as shown in Equation 21, is performed with the current estimate of $\hat{R}_x(t,\omega)$. As the updates are computed in the frequency domain, it is quite natural to implement the actual filtering with an overlap-save routine. For this, one takes signal windows of size 2T and steps by T samples to obtain the next block of data. These blocks of data can be used for both the gradient and estimation updates. However, it may be necessary to perform more gradient steps before visiting new data. That is, one may want to update more frequently within that time T. In general, for a given frame rate, r, one would compute the 2T frequency components and update $W(\omega)$ and $\hat{R}_x(t,\omega)$ at t=T/r, 2T/r, 3T/r, . . . . Conventional overlap and save corresponds to r=1.

III System Embodiment

Figure 5:
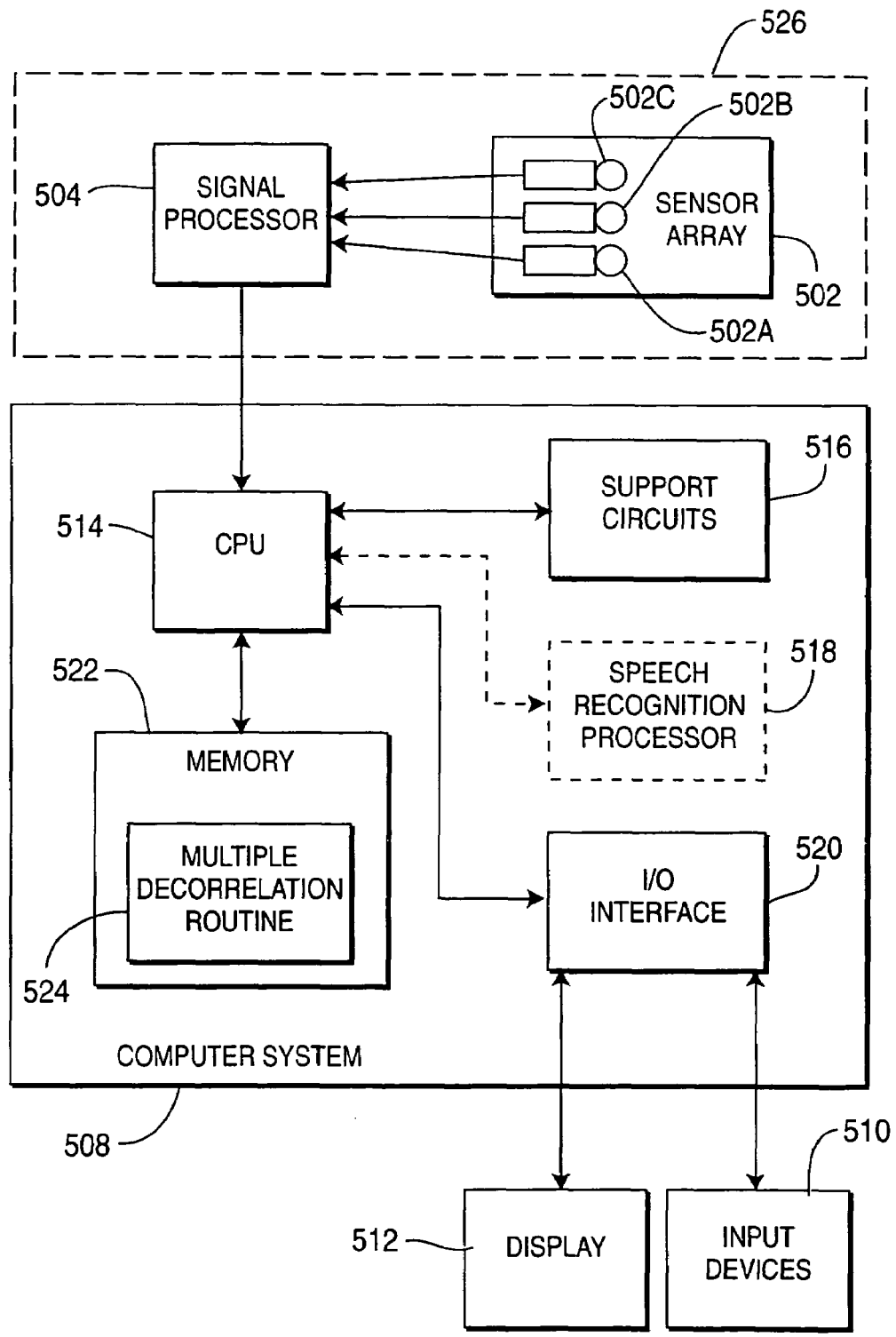
FIG. 5 depicts a system for executing a software implementation of the present invention.

FIG. 5 depicts a system for implementing the source separation method of either the off-line or on-line embodiments of the BSS methodology of the invention. The system comprises a convolved signal source 526 that supplies the signal that is to be separated into its component signals and a computer system 508 that executes the multiple decorrelation routine 524 of the present invention. The source 526 may contain any source of convolved signals, but is illustratively shown to contain a sensor array 502 and a signal processor 504. The sensor array contains one or more transducers 502A, 502B, 502C such as microphones. The transducers are coupled to a signal processor 504 that performs signal digitization. A digital signal is coupled to the computer system 508 for signal separation and further processing.

The computer system 508 comprises a central processing unit (CPU) 514, a memory 522, support circuits 516, and an input/output (I/O) interface 520. The computer system 508 is generally coupled through the I/O interface 520 to a display 512 and various input devices 510, such as a mouse and keyboard. The support circuits generally contain well-known circuits such as cache, power supplies, clock circuits, a communications bus, and the like. The memory 522 may include random access memory (RAM), read only memory (ROM), disk drive, tape drive, and the like, or some combination of memory devices. The invention is implemented as the multiple decorrelation routine 524 that is stored in memory 522 and executed by the CPU 514 to process the signal from the signal source 526. As such, the computer system 508 is a general purpose computer system that becomes a specific purpose computer system when executing the routine 524 of the present invention. Although a general purpose computer system is illustratively shown as a platform for implementing the invention, those skilled in the art will realize that the invention can also be implemented in hardware as an application specific integrated circuit (ASIC), a digital signal processing (DSP) integrated circuit, or other hardware device or devices. As such, the invention may be implemented in software, hardware, or a combination of software and hardware.

The illustrative computer system 508 may also contain a speech recognition processor 518, e.g., a speech recognition circuit card or a speech recognition software, that is used to process the component signals that the invention extracts from the convolutive signal. As such, a conference room having a plurality of people speaking and background noise can be monitored with multiple microphones 502. The microphones 502 produce a composite speech signal that requires separation into component signals if a speech recognition system is to be used to convert each person's speech into computer text or into computer commands. The composite speech signal is filtered, amplified and digitized by the signal processor 504 and coupled to the computer system 508. The CPU 514, executing the multiple decorrelation routine 524, separates the composite signal into its constituent signal components. From these constituent components, background noise can easily be removed. The constituent components without noise would then be coupled to the speech recognition processor 518 to process the component signals into computer text or computer commands. In this manner, the computer system 508 while executing the multiple decorrelation routine 524 is performing signal pre-processing or conditioning for the speech recognition processor 518.

Although various embodiments which incorporate the teachings of the present invention have been shown and described in detail herein, those skilled in the art can readily devise many other varied embodiments that still incorporate these teachings.

Accordingly, it is intended that all such alternatives, modifications, permutations, and variations to the exemplary embodiments can be made without departing from the scope and spirit of the present invention.

What is claimed is:

1. A method for separating a plurality of mixed signals into a plurality of component signals comprising the steps of:
    (a) producing a plurality of discrete Fourier transform (DFT) values corresponding to frequency components of an input segment of said mixed signals;
    (b) updating cross correlation estimation matrices using said DFT values;
    (c) computing, using a cost-function minimization process, an update value for a plurality of filter coefficients for a finite impulse response (FIR) filter using said cross correlation estimation values;
    (d) filtering said mixed signals using said FIR filter having said updated filter coefficients to separate said mixed signals into one or more component signals, wherein at least one of the one or more component signals comprises acoustic waves; and
    (e) iteratively repeating steps (a), (b), (c) and (d) for successive input segments of said mixed signal.

2. The method of claim 1 wherein said acoustic waves are created by the body of a living species.

3. The method of claim 1 wherein said acoustic waves are created by industrial processes.

4. The method of claim 1 wherein said acoustic waves are created by chemical processes.

5. The method of claim 1 wherein said acoustic waves are created by equipment, machinery, devices, systems or components.

6. The method of claim 5 wherein said acoustic waves are analog or digital.

7. The method of claim 5 wherein said acoustic waves are created by mechanical, electrical, optical, electro-optical, magnetic or electro-mechanical means.

8. An apparatus for separating a plurality of mixed signals into a plurality of component signals comprising:
    means for producing a plurality of discrete Fourier transform (DFT) values corresponding to frequency components of an input segment of said mixed signals;
    means for updating cross correlation estimation matrices using said DFT values; a cost-function minimization processor for computing an update value for a plurality of filter coefficients for a finite impulse response (FIR) filter using said cross correlation estimation values; and an FIR filter having said updated filter coefficients to separate said mixed signals into one or more component signals, wherein at least one of the one or more component signals comprises acoustic waves.

9. The apparatus of claim 8 wherein said acoustic waves are created by the body of a living species.

10. The apparatus of claim 8 wherein said acoustic waves are created by industrial processes.

11. The apparatus of claim 8 wherein said acoustic waves are created by chemical processes.

12. The apparatus of claim 8 wherein said acoustic waves are created by analog or digital means.

13. A computer readable storage medium containing a program that, when executed upon a general purpose computer system, causes said general purpose computer system to become a specific purpose computer system that performs a method for separating a plurality of mixed signals into a plurality of component signals comprising the steps of:

(a) producing a plurality of discrete Fourier transform (DFT) values corresponding to frequency components of an input segment of said mixed signals;

(b) updating cross correlation estimation matrices using said DFT values;

(c) computing, using a cost-function minimization process, an update value for a plurality of filter coefficients for a finite impulse response (FIR) filter using said cross correlation estimation values;

(d) filtering said mixed signals using said FIR filter having said updated filter coefficients to separate said mixed signals into one or more component signals, wherein at least one of the one or more component signals comprises acoustic waves; and (e) iteratively repeating steps (a), (b), (c) and (d) for successive input segments of said mixed signal.

14. The computer readable storage medium of claim 13 wherein said acoustic waves are created by the body of a living species.

15. The computer readable storage medium of claim 13 wherein said acoustic waves are created by industrial processes.

16. The computer readable storage medium of claim 13 wherein said acoustic waves are created by chemical processes.

17. The computer readable storage medium of claim 13 wherein said acoustic waves are created by mechanical processes.

18. The computer readable storage medium of claim 13 wherein said acoustic waves are created by electrical processes.

19. The computer readable storage medium of claim 13 wherein said acoustic waves are created by optical processes.

* * * * *